(12) United States Patent
Sheng et al.

(10) Patent No.: US 10,883,518 B2
(45) Date of Patent: Jan. 5, 2021

(54) WATER PUMP COOLER FOR CPU

(71) Applicants: Bao Hua Sheng, DongGuan (CN);
Hong Yan Liao, DongGuan (CN)

(72) Inventors: Bao Hua Sheng, DongGuan (CN);
Hong Yan Liao, DongGuan (CN)

(73) Assignee: Dongguan Zhenpin Hardware Cooling Technology Co. Ltd, DongGuan (CN)

( * ) Notice: Subject to any disclaimer, the term of this patent is extended or adjusted under 35 U.S.C. 154(b) by 242 days.

(21) Appl. No.: 15/635,700

(22) Filed: Jun. 28, 2017

(65) Prior Publication Data

US 2018/0023594 A1  Jan. 25, 2018

(30) Foreign Application Priority Data

Jul. 25, 2016 (CN) .......................... 2016 1 0591615

(51) Int. Cl.
| | |
|---|---|
| *F04D 29/58* | (2006.01) |
| *F04D 29/22* | (2006.01) |
| *F04D 29/42* | (2006.01) |
| *F04D 1/06* | (2006.01) |
| *F04D 29/00* | (2006.01) |
| *F28D 15/00* | (2006.01) |

(Continued)

(52) U.S. Cl.
CPC .......... *F04D 29/5866* (2013.01); *F04D 1/06* (2013.01); *F04D 29/007* (2013.01); *F04D 29/22* (2013.01); *F04D 29/426* (2013.01); *F04D 29/5873* (2013.01); *F28D 15/00* (2013.01); *G06F 1/20* (2013.01); *H05K 7/20272* (2013.01); *G06F 2200/201* (2013.01)

(58) Field of Classification Search
CPC ...... F04D 29/5866; F04D 1/06; F04D 29/007; F04D 29/22; F04D 29/426; F04D 29/5873; F28D 15/00; G06F 1/20; G06F 2200/201; H05K 7/20272
USPC ....................................................... 165/80.4
See application file for complete search history.

(56) References Cited

U.S. PATENT DOCUMENTS 3,767,321 A * 10/1973 Layne .................. F04D 29/106
 415/110
4,994,078 A * 2/1991 Jarvik ................. A61M 1/1003
 415/900

(Continued)

*Primary Examiner* — Tho V Duong
*Assistant Examiner* — Raheena R Malik

(57) ABSTRACT

A water pump cooler for CPU wherein coolant may efficiently perform heat exchange, comprising at least: at least a heat absorbing component, at least a heat-transfer water pump, at least a heat exchange component and connecting water pipes, wherein a closed loop is formed by the heat-transfer water pump, connecting water pipes and heat exchange component. The heat-transfer water pump is disposed above the heat absorbing component to serve as a cycle power source for the coolant. The heat-transfer water pump includes at least a water pump component, which includes at least a base plate and a plurality of rotor axial impeller sections and rotor centrifugal impeller sections. The coolant is driven by the rotor axial impeller sections to flow into the rotor centrifugal impeller sections, and is then thrown at a high speed by the rotor centrifugal impeller sections to the heat exchange component for efficient heat dissipation. In this way, the coolant may perform heat exchange at a high speed within the closed loop.

9 Claims, 4 Drawing Sheets

(51) Int. Cl.
*G06F 1/20* (2006.01)
*H05K 7/20* (2006.01)

(56) References Cited

U.S. PATENT DOCUMENTS

| | | | | |
|---|---|---|---|---|
| 6,384,508 B1 * | 5/2002 | Marioni | ............... | F04D 13/021 |
| | | | | 310/261.1 |
| 6,955,212 B1 * | 10/2005 | Hsieh | ............... | F28D 1/024 |
| | | | | 165/80.4 |
| 7,249,625 B2 * | 7/2007 | Duan | ............... | G06F 1/20 |
| | | | | 165/104.28 |
| 7,379,301 B2 * | 5/2008 | Liu | ............... | H01L 23/473 |
| | | | | 165/104.31 |
| 7,404,433 B1 * | 7/2008 | Hu | ............... | H01L 23/473 |
| | | | | 165/104.33 |
| 7,537,048 B2 * | 5/2009 | Liu | ............... | F28D 1/05366 |
| | | | | 165/104.33 |
| 7,688,589 B2 * | 3/2010 | Chiang | ............... | F04D 29/00 |
| | | | | 165/104.28 |
| 7,694,721 B2 * | 4/2010 | Lai | ............... | H01L 23/4006 |
| | | | | 165/104.33 |
| 7,704,054 B2 * | 4/2010 | Horvath | ............... | F04D 1/06 |
| | | | | 415/131 |
| 7,729,118 B2 * | 6/2010 | Lai | ............... | H01L 23/473 |
| | | | | 165/104.33 |
| 7,753,662 B2 * | 7/2010 | Lai | ............... | F04D 13/0606 |
| | | | | 165/80.4 |
| 8,051,898 B2 * | 11/2011 | Chiang | ............... | H01L 23/473 |
| | | | | 165/104.28 |
| 8,210,829 B2 * | 7/2012 | Horvath | ............... | F04D 1/06 |
| | | | | 415/131 |
| 8,535,212 B2 * | 9/2013 | Robert | ............... | F04D 29/445 |
| | | | | 600/16 |
| 8,631,860 B2 * | 1/2014 | Tang | ............... | G06F 1/20 |
| | | | | 123/41.51 |
| 8,746,326 B2 * | 6/2014 | Mou | ............... | H01L 23/473 |
| | | | | 165/104.33 |
| 8,777,832 B1 * | 7/2014 | Wang | ............... | A61M 1/1024 |
| | | | | 600/16 |
| 9,057,567 B2 * | 6/2015 | Lyon | ............... | F28D 15/00 |
| 9,919,085 B2 * | 3/2018 | Throckmorton | ..... | A61M 1/1006 |
| 2004/0265122 A1 * | 12/2004 | Bresolin | ............... | F04D 15/0077 |
| | | | | 415/203 |
| 2006/0099068 A1 * | 5/2006 | Tanabe | ............... | F04D 1/025 |
| | | | | 415/143 |

* cited by examiner

WATER PUMP COOLER FOR CPU

BACKGROUND OF THE INVENTION

1. Field of the Invention

The present invention relates to a water pump cooler, and more specifically, the present invention relates to a water pump cooler which achieves the purpose of heat dissipation and cooling by mixing positive and negative pressures to drive coolant to discharge heat energy effectively from a heating source.

2. Description of Related Art

In a conventional technology of CPU heat dissipation, liquid (coolant) and air are employed as media to perform heat exchange with a CPU (heating source). That is, to effectively lower the temperature of a CPU, heat exchange is first performed between the CPU (heating source) and circulating liquid (coolant), and then a fan (or other cooling material) is employed to transfer heat energy to an exterior space with the liquid. One disadvantage of this cooling technology is that the heat dissipation area produced by the fan and the heat-energy-carrying liquid is limited by the space of the computer, so that the liquid may not be cooled down in time before performing the next heat exchange with the CPU.

Therefore, it is a purpose of the present invention to enhance the efficiency of performing heat exchange with the heat energy in the liquid.

SUMMARY OF THE INVENTION

To achieve the foregoing purpose, the present invention provides a water pump cooler for CPU wherein coolant may efficiently perform heat exchange, comprising at least: at least a heat absorbing component, at least a heat-transfer water pump, at least a heat exchange component and connecting water pipes, wherein a closed loop is formed by the heat-transfer water pump, connecting water pipes and heat exchange component. The heat-transfer water pump is disposed above the heat absorbing component to serve as a cycle power source for the coolant. The heat-transfer water pump includes at least a water pump component, which includes at least a base plate and a plurality of rotor axial impeller sections and rotor centrifugal impeller sections. The coolant is driven by the rotor axial impeller sections to flow into the rotor centrifugal impeller sections, and is then thrown at a high speed by the rotor centrifugal impeller sections to the heat exchange component for efficient heat dissipation. In this way, the coolant may perform heat exchange at a high speed within the closed loop.

According to the foregoing main features, the rotor axial impeller sections and rotor centrifugal impeller sections are integral, and they may remove air, extract air around the impeller, and reduce noises.

According to the foregoing main features, in the water tank is disposed an impeller which rotates as the coolant flows. The mechanical action of the heat-transfer water pump may provide aesthetic beauty and pleasure.

According to the foregoing main features, on the water pump base plate is disposed a silicon steel sheet, on which is glued a light conducting plate thereon are arranged some RGB lights. As RGB lights may provide multiple color changes, multi-color lights are emitted when the light conducting plate is operating. The light conducting plate extends light to every corner of the water tank, bestowing a vibrant light effect and dynamic beauty on the flowing coolant. The water pump and light conducting plate may achieve various iridescent and dynamic effects, with the rotation of the impeller providing further splendor. Therefore, this water pump cooler may be arranged in a transparent water tank for appreciation.

According to the foregoing main features, the heat exchange component includes an evaporator and a fan, wherein a plurality of channels are disposed in the evaporator for liquid flow.

An advantage of the present invention is that it provides an excellent heat dissipating effect. Firstly, a heat absorbing component with high metallic thermal conductivity is employed to perform heat exchange with a heating source (e.g. CPU). The coolant in the heat-transfer water pump then speedily absorbs a great amount of the heat energy in the heat absorbing component and speedily flows to the evaporator having a large heat dissipating area where it is speedily cooled down before performing the next heat exchange. An advantageous effect of the present invention is that the rotor is a combination of axial and centrifugal impeller sections, so that the liquid flow of the heat dissipating water pump is unique. The rotor axial impeller sections may effectively increase the flow rate of the coolant, and the rotor centrifugal impeller sections throw the coolant out through the gaps in the rotor cover plate into the liquid outlet hole. This liquid flow may increase the quantity of flow and the flow rate of the coolant, further effectively enhancing the heat dissipating performance of the cooler.

DETAILED DESCRIPTION OF THE PREFERRED EMBODIMENTS

Figure 1:
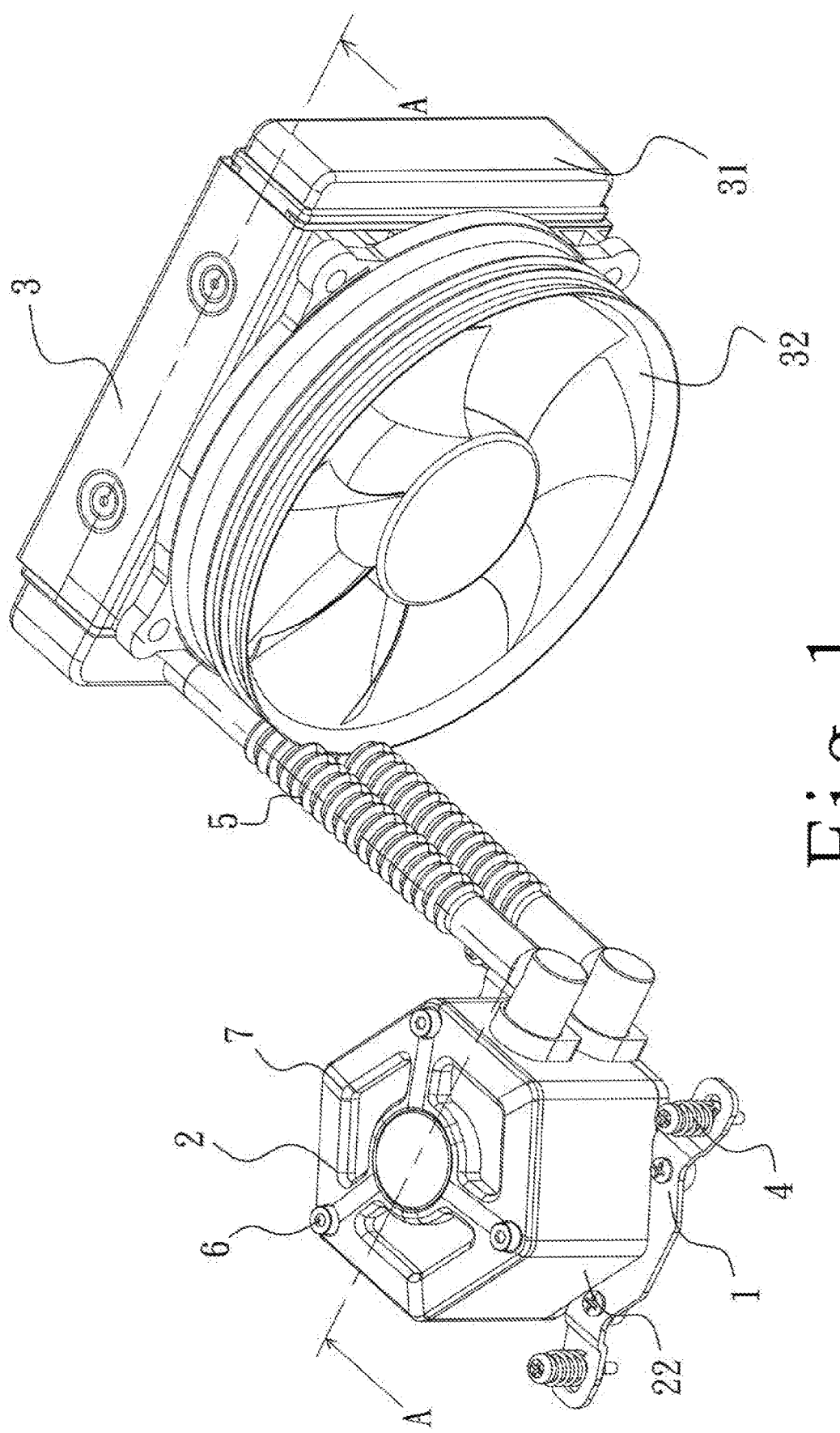
FIG. 1 is a structural perspective view of the present invention.
Figure 2:
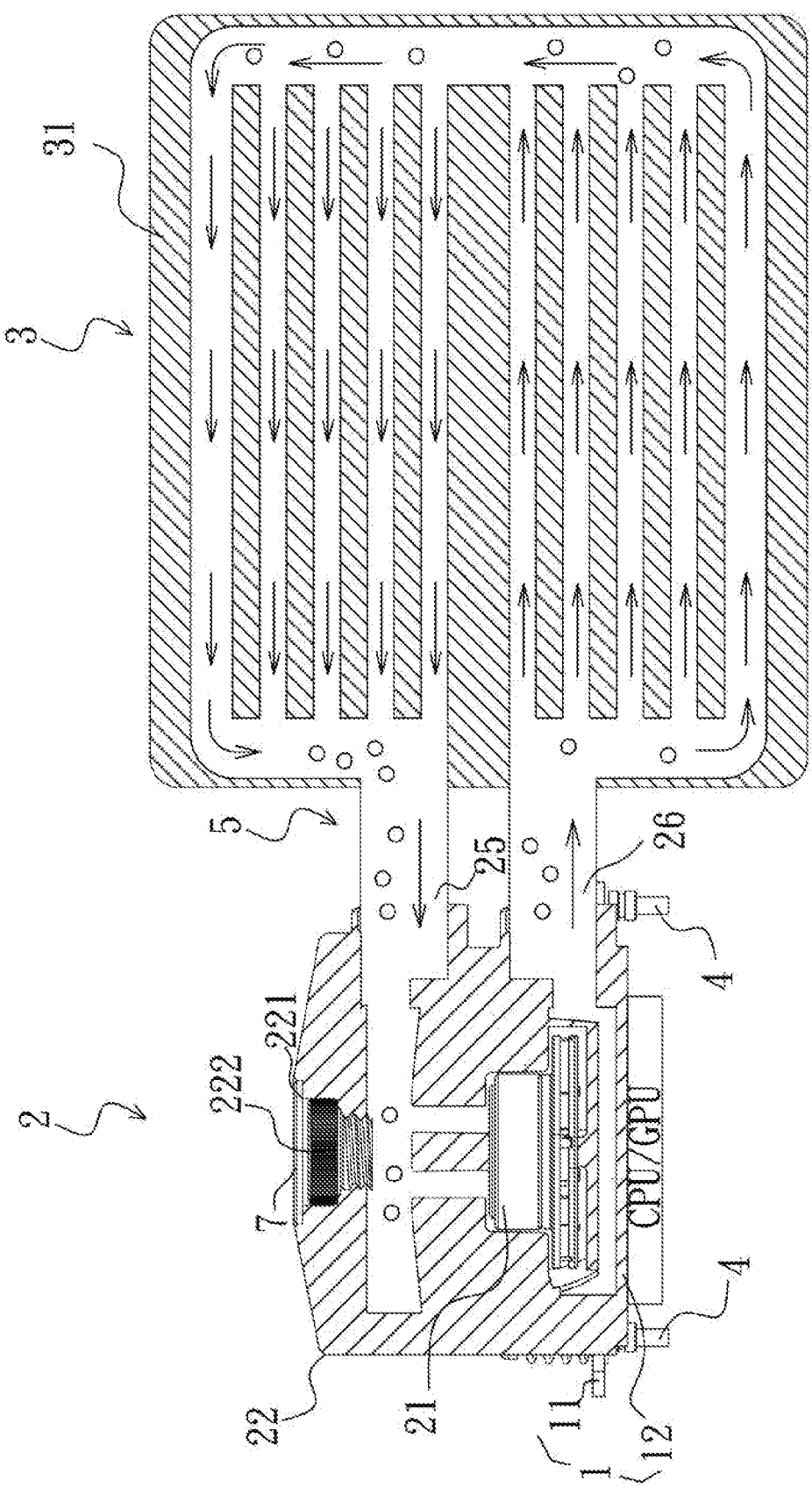
FIG. 2 is an A-A cross-section view of FIG. 1 according to the present invention.
Figure 3:
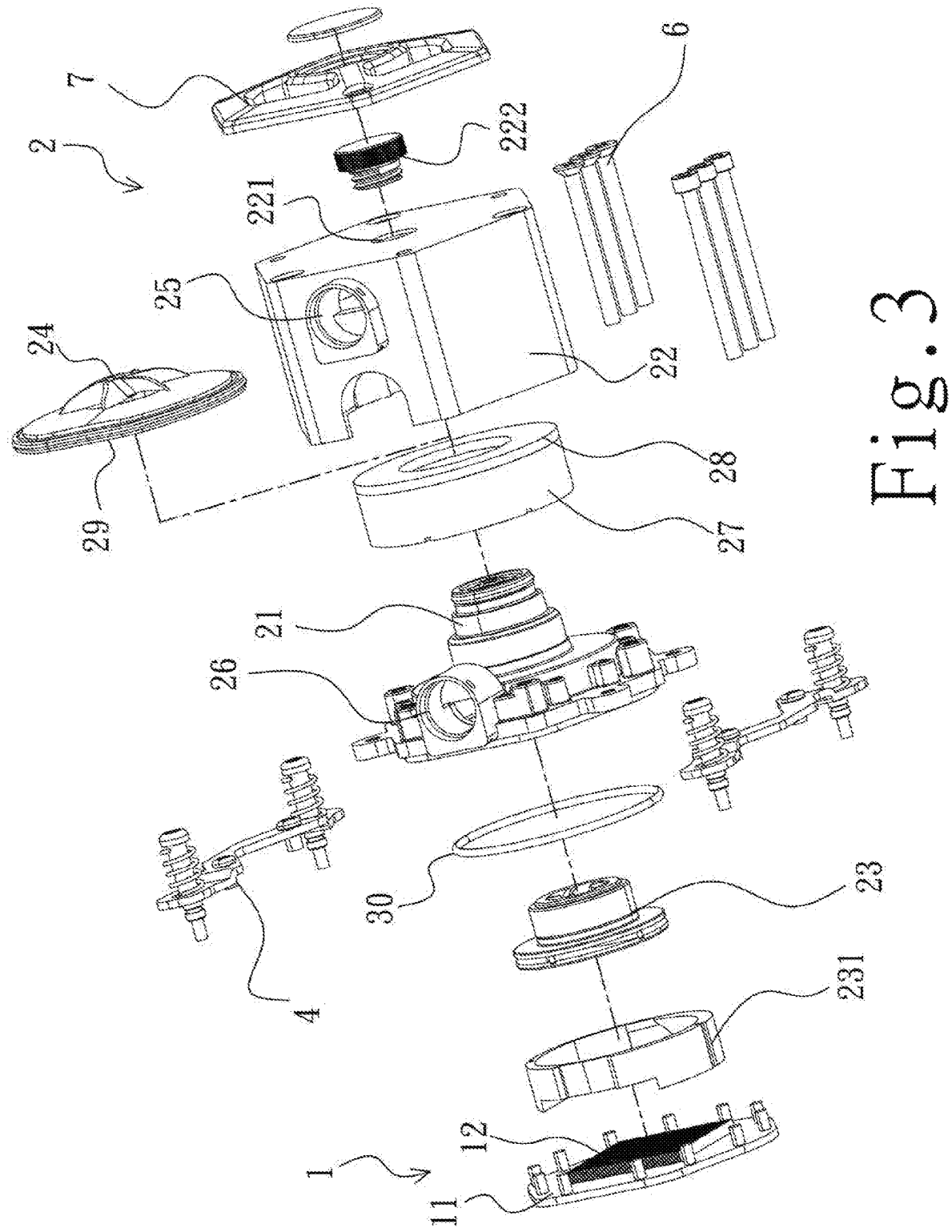
FIG. 3 is a structural perspective view of a heat-transfer water pump according to the present invention.
Figure 4:
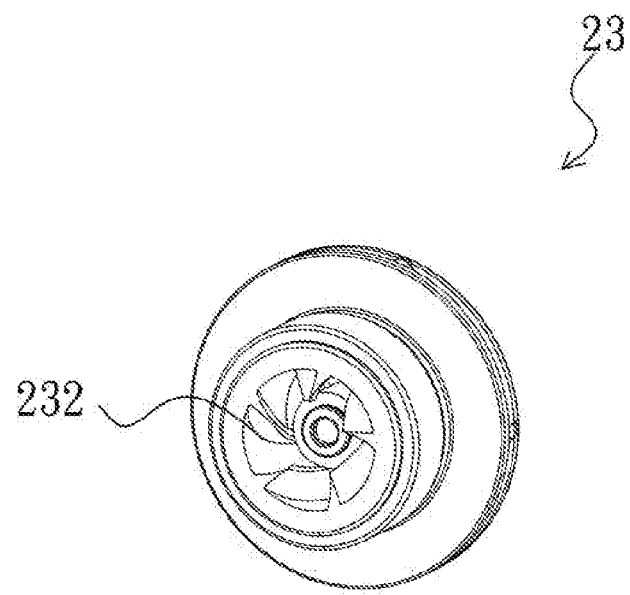
FIG. 4 is a perspective view of a rotor axial impeller section according to the present invention.
Figure 5:
FIG. 5 is a structural perspective view of a rotor centrifugal impeller section according to the present invention.
Figure 5:
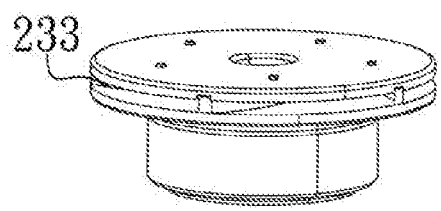

Please refer to FIGS. 1, 2, 3, 4 as well as FIG. 5. The present invention relates to a water pump cooler for CPU, comprising: a heat absorbing component 1, a heat-transfer water pump 2, a heat exchange component 3 and water pipes 5. The heat-transfer water pump 2 is disposed above the heat absorbing component 1 and connected thereto with a fastening unit 4. The heat-transfer water pump 2 includes a water pump 21 and a water tank 22 covering the water pump 21. The water tank 22 is made of a transparent material, so that the liquid flow in the water tank 22 is visible. The water tank 22 and water pump 21 may be integral for increasing the coolant capacity while reducing the cooler volume. The water tank 22 has a liquid inlet hole 25 and a liquid outlet hole 26. The liquid inlet hole 25 and liquid outlet hole 26 are respectively connected to the heat exchange component 3 with water pipes 5. The water pump 21 includes a base plate therein is disposed a rotor 23. The rotor 23 is a combination of axial and centrifugal impeller sections. The rotor 23 includes rotor axial impeller sections 232 and rotor centrifugal impeller sections 233 which are successively connected from top to bottom. The coolant flows into the rotor axial impeller sections 232 which may effectively increase the flow rate of the coolant. The rotor centrifugal impeller sections 233 throw the coolant out through the gaps in the rotor cover plate 231 into the liquid outlet hole 26. After the coolant flows through the water pipe 5 into the heat exchange component 3, the coolant first absorbs heat and rises in temperature, then cools down and drops in temperature, flows out of the heat exchange component 3, and flows into the liquid inlet hole 25 via the water pipe 5.

The water tank 22 ensures that the coolant flowing into the rotor 23 fills the entire space and ensures a maximum flow capacity. The coolant flows through the rotor axial impeller sections 232 into the rotor centrifugal impeller sections 233, and is thrown out through the gaps in the rotor cover plate 231 by the rotor centrifugal impeller sections 233. The coolant then flows through the liquid outlet hole 25, water pipe 5, heat exchange component 3 and liquid inlet hole 26, forming a closed loop. This liquid flow may increase the quantity of flow and the flow rate of the coolant, further effectively enhancing the heat dissipating performance of the cooler.

Preferably, in the water tank 22 is disposed an impeller 24 which rotates as the coolant flows. The mechanical action of the heat-transfer water pump may provide aesthetic beauty and pleasure. The rotor 23 may remove air, extract air around the impeller 24, reduce noises, and provide the effect that the heat-transfer water pump 2 is full of liquid. Further, the impeller 24 is driven to rotate by the liquid flow and increase the mechanical dynamism of the heat-transfer water pump 2.

Preferably, in the water tank 22 is disposed a light conducting plate 28, which extends light to every corner of the water tank 22, bestowing a vibrant light effect and dynamic beauty on the flowing coolant. The water pump 21 and light conducting plate 28 may achieve various iridescent and dynamic effects, with the rotation of the impeller 24 providing further splendor. Therefore, this water pump cooler may be arranged in a transparent water tank 22 for appreciation.

Preferably, on the water pump 21 is disposed a silicon steel sheet 27, on which is glued a light conducting plate 28 thereon are arranged some RGB lights. Multi-color lights are emitted when the light conducting plate 28 is operating, enhancing the splendor of the heat-transfer water pump 2.

Preferably, to increase the airtightness of the rotor 232, a sealing ring 30 is arranged to sheath the rotor 232.

Preferably, the heat absorbing component 1 includes a base plate 11 and a copper sheet 12 disposed thereon.

Preferably, the heat exchange component 3 includes an evaporator 31 and a fan 32, wherein a plurality of channels are disposed in the evaporator 31 for liquid flow.

Preferably, at a top of the case body of the water tank 22 is disposed a decoration cover 7, which may be replaced separately.

Preferably, at a top of the water tank 22 is disposed a liquid feeding hole 221 in a parallel manner.

Preferably, in the liquid feeding hole 221 is disposed a plug 222.

Preferably, in the water tank 22 is an inner plate 29 ultrasonically welded on an inner wall of the water tank 22, wherein the impeller 24 is disposed on the inner plate 29.

The operating principle of the present invention is to first connect the evaporator, fan, water pipes, heat-transfer water pump, and heat absorbing component; then pull the plug, fill the water tank with water through the liquid feeding hole, seal the hole with the plug, and place the heat absorbing component on the CPU/GPU. When the cooler is operating, the water in the water tank case body is driven by the rotation of the rotor to pass through the liquid outlet hole 26, water pipe 5, evaporator 31, water pipe 5, and liquid inlet hole 25, which form a closed loop. The heat absorbing component 1 contacts the CPU/GPU, and takes away the heat energy in the CPU/GPU by having its copper plate 12 perform heat exchange with the CPU/GPU. The coolant transfers the heat energy to the water when passing through the copper sheet 12, takes away the heat energy in the form relieved tooth when passing through it, flows to the evaporator 31, discharges the heat energy in the evaporator 31, and flows back to the water tank 22. That is, the water flows to the channels for liquid flow 31 through the liquid outlet hole and contacts the thin aluminum blocks in the channels for liquid flow 31, so that the thin aluminum blocks may absorb the heat energy in the water. The rotation of the fan 32 drives the air flow and takes away the heat energy in the thin aluminum blocks. The coolant continues to flow through the water pipes 5 and liquid inlet hole 24 before again returning to the water tank 22 into the water pump 21. A circular waterway is thus formed and heat dissipation for the CPU/GPU in contact with the heat absorbing component 1 may be continued.

What is claimed is:

1. A water pump cooler for CPU, comprising:
   a heat absorbing component,
   a heat-transfer water pump,
   a heat exchange component, and
   connecting water pipes,
   wherein a closed loop is formed by the heat-transfer water pump, the connecting water pipes and the heat exchange component;
   the heat-transfer water pump is disposed above the heat absorbing component to serve as a cycle power source for a coolant;
   the heat-transfer water pump includes a water pump component and a water tank covering the water pump component, the water tank is made of a transparent material and has a liquid inlet hole and a liquid outlet hole, the water pump component includes a base plate and a rotor, the rotor comprises a rotor axial impeller section and a rotor centrifugal impeller section, the rotor axial impeller section and the rotor centrifugal impeller section are successively connected from top to bottom;
   the coolant is driven by the rotor axial impeller section to flow into the rotor centrifugal impeller section, and is thrown by the rotor centrifugal impeller section through a gap in a rotor cover plate into the liquid outlet hole, the rotor cover plate surrounds the rotor centrifugal impeller section and locates between the rotor and the liquid outlet hole;
   an inner plate is welded on an inner wall of the water tank and an impeller is disposed on the inner plate in the water tank, and the rotor extracts air around the impeller.

2. The water pump cooler for CPU of claim 1, wherein the rotor axial impeller section and rotor centrifugal impeller section are integral.

3. The water pump cooler for CPU of claim 1, wherein on the water pump base plate is disposed a silicon steel sheet, on which is glued a light conducting plate thereon are arranged some RGB lights.

4. The water pump cooler for CPU of claim 1, wherein the heat exchange component includes an evaporator and a fan with channels for liquid flow disposed in the evaporator.

5. The water pump cooler for CPU of claim 1, wherein the heat absorbing component includes a base plate and a copper sheet disposed thereon.

6. The water pump cooler for CPU of claim 1, wherein at a top of a case body of the water tank is disposed a decoration cover.

7. The water pump cooler for CPU of claim 6, wherein the case body of the water tank and the heat dissipating water pump are fixedly connected with flat head screws.

8. The water pump cooler for CPU of claim 7, wherein at a top of the case body of the water tank is disposed a liquid feeding hole in a parallel manner.

9. The water pump cooler for CPU of claim 8, wherein in the liquid feeding hole is disposed a plug.

\* \* \* \* \*